(12) United States Patent
Yabuki et al.

(10) Patent No.: US 6,906,908 B1
(45) Date of Patent: Jun. 14, 2005

(54) SEMICONDUCTOR DEVICE AND METHOD OF MANUFACTURING THE SAME

(75) Inventors: Moto Yabuki, Tokyo (JP); Andreas Hilliger, Taipei (TW)

(73) Assignees: Kabushiki Kaisha Toshiba, Tokyo (JP); Infineon Technologies, AG, Munich (DE)

( * ) Notice: Subject to any disclaimer, the term of this patent is extended or adjusted under 35 U.S.C. 154(b) by 0 days.

(21) Appl. No.: 10/849,111

(22) Filed: May 20, 2004

(51) Int. Cl.$^7$ ................................................ H01G 4/20
(52) U.S. Cl. .................... 361/312; 361/306.3; 361/329; 257/295; 438/238; 438/244
(58) Field of Search ...................... 361/306.3, 311–313, 361/328–330; 257/295–296, 301, 303; 438/240, 253, 396

(56) References Cited

U.S. PATENT DOCUMENTS

| | | | |
|---|---|---|---|
| 5,306,952 A | * | 4/1994 | Matsuura et al. ........... 257/165 |
| 6,004,839 A | | 12/1999 | Hayashi et al. |
| 6,051,858 A | * | 4/2000 | Uchida et al. .............. 257/295 |
| 6,083,826 A | * | 7/2000 | Kim et al. ................... 438/631 |
| 6,576,942 B2 | * | 6/2003 | Okutoh et al. .............. 257/295 |

FOREIGN PATENT DOCUMENTS

| | | |
|---|---|---|
| JP | 11-126881 | 5/1999 |
| JP | 2001-44376 | 2/2001 |

* cited by examiner

*Primary Examiner*—Anthony Dinkins
(74) *Attorney, Agent, or Firm*—Oblon, Spivak, McClelland, Maier & Neustadt, P.C.

(57) ABSTRACT

Disclosed is a semiconductor device comprising a semiconductor substrate, a capacitor provided above the semiconductor substrate, an insulation region which covers the capacitor and has a first hole and a second hole, the first hole being provided apart from the capacitor and extending in a vertical direction with respect to a main surface of the semiconductor substrate, the second hole reaching an electrode of the capacitor, extending in the vertical direction with respect to the main surface of the semiconductor substrate and being shallower than the first hole, a tungsten plug provided in the first hole, a first oxygen barrier film provided between the tungsten plug and a side wall of the first hole, and a conductive plug provided in the second hole and connected to the electrode of the capacitor.

15 Claims, 5 Drawing Sheets

US 6,906,908 B1

SEMICONDUCTOR DEVICE AND METHOD OF MANUFACTURING THE SAME

BACKGROUND OF THE INVENTION

1. Field of the Invention

This invention relates to a semiconductor device, in particular, a semiconductor device having a capacitor.

2. Description of the Related Art

In recent years, ferroelectric memories (FeRAM: Ferroelectric Random Access Memory) using a ferroelectric film as dielectric film of a capacitor have been being developed.

In manufacturing ferroelectric memories, it is necessary to form various plugs connected to capacitors and transistors, etc. Aluminum (Al) is widely used as material of these plugs. However, with microminiaturization of elements, it is getting more difficult to fill contact holes with aluminum plugs. In particular, if a plug is formed in a deep contact hole, it is getting more difficult to apply aluminum.

Therefore, it is one choice to use tungsten (W) plugs having an excellent filling property, instead of aluminum plugs. However, tungsten tends to be oxidized, and thus a problem can occur that tungsten plugs deteriorate by annealing in oxygen atmosphere for improving the capacitor property. This can cause a problem of deterioration of property and reliability of ferroelectric memories due to contact failure or the like.

As prior art, Jpn. Pat. Appln. KOKAI Pub. No. 11-126881, Jpn. Pat. Appln. KOKAI Pub. No. 2001-44376, and U.S. Pat. No. 6,004,839 disclose a semiconductor device having a ferroelectric capacitor. However, the techniques disclosed in these documents relate to a protector for capacitor, such as a hydrogen barrier film, and protection of plugs is not considered at all.

As described above, conventional ferroelectric memories have the problem that filling contact holes with plug material is difficult with microminiaturization of elements, and the problem of deterioration of plug material due to oxidation. Therefore, it is difficult to obtain a semiconductor device having excellent property and reliability.

BRIEF SUMMARY OF THE INVENTION

According to a first aspect of the present invention, there is provided a semiconductor device comprising: a semiconductor substrate; a capacitor provided above the semiconductor substrate; an insulation region which covers the capacitor and has a first hole and a second hole, the first hole being provided apart from the capacitor and extending in a vertical direction with respect to a main surface of the semiconductor substrate, the second hole reaching an electrode of the capacitor, extending in the vertical direction with respect to the main surface of the semiconductor substrate and being shallower than the first hole; a tungsten plug provided in the first hole; a first oxygen barrier film provided between the tungsten plug and a side wall of the first hole; and a conductive plug provided in the second hole and connected to the electrode of the capacitor.

According to a second aspect of the present invention, there is provided a method of manufacturing a semiconductor device, comprising: forming a capacitor above a semiconductor substrate, the capacitor being covered with an insulation region; forming a first hole in the insulation region, the first hole being provided apart from the capacitor and extending in vertical direction with respect to a main surface of the semiconductor substrate; forming a first oxygen barrier film on a side wall of the first hole; forming a tungsten plug in the first hole being provided with the first oxygen barrier film; forming a second hole in the insulation region, the second hole reaching an electrode of the capacitor, extending in the vertical direction with respect to the main surface of the semiconductor substrate and being shallower than the first hole; and forming a conductive plug in the second hole.

DETAILED DESCRIPTION OF THE INVENTION

An embodiment of the present invention is explained with reference to the drawings.

FIGS. 1–9 are cross-sectional views illustrating a method of manufacturing a semiconductor device according to an embodiment of the present invention.

Figure 1:
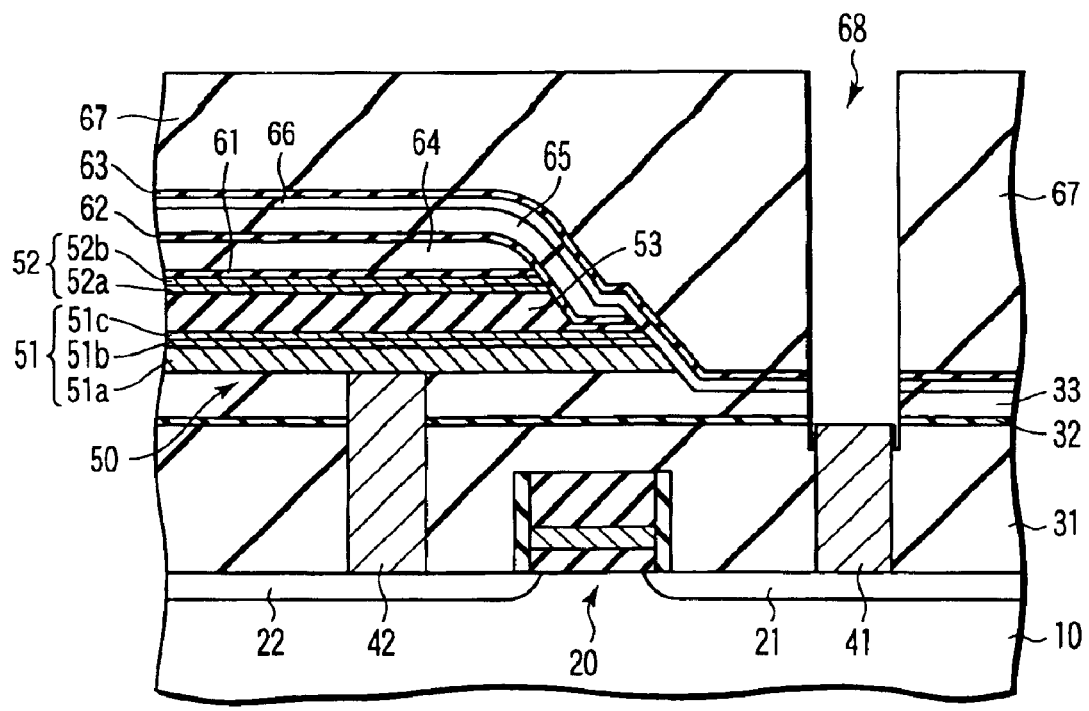
FIGS. 1–9 are cross-sectional views illustrating a method of manufacturing a semiconductor device according to an embodiment of the present invention.

First, as shown in FIG. 1, an MIS transistor 20 is formed on a semiconductor substrate 10 such as a silicon substrate. Thereafter, an insulation region including an interlevel insulating film and the like and plugs are formed on the semiconductor substrate 10. The insulation region includes silicon oxide films 31 and 33 and a silicon nitride film 32. A plug 41 is connected to a diffusion layer (one of a source and a drain) 21 of the MIS transistor 20, and a plug 42 is connected to a diffusion layer (the other of the source and the drain) 22 of the MIS transistor 20. Tungsten or polysilicon may be used as material of the plugs.

Next, a capacitor 50 and an insulation region including an interlevel insulating film and the like are formed above the semiconductor substrate 10. The capacitor 50 is formed of a bottom electrode 51, a top electrode 52, and a dielectric film 53. As the dielectric film 53, a $Pb(Zr_xTi_{1-x})O_3$ film (PZT film) being a ferroelectric film is used. The bottom electrode 51 is connected to the plug 42, and is formed of a stacked film comprising an iridium (Ir) film 51a, platinum (Pt) film 51b and $SrRuO_3$ (SRO) film 51c. The top electrode 52 is formed of a stacked film comprising an SRO film 52a and a platinum film 52b. The insulation region comprises alumina ($Al_2O_3$) films 61, 62 and 63 and silicon oxide films 64, 65, 66 and 67. The alumina films 61, 62 and 63 have barrier property against oxygen and hydrogen, and thus can prevent oxygen and hydrogen from intruding into the capacitor 50 when the capacitor 50 is processed and when the silicon oxide films 64, 65, 66 and 67 are deposited.

Next, with a photoresist (not shown) used as mask, the silicon nitride film 32, the silicon oxide films 33, 66, 67 and the alumina film 63 are etched. As the etching, adopted is anisotropic etching such as reactive ion etching (RIE). Thereby, a contact hole 68 which extends in a vertical direction with respect to a main surface of the semiconductor substrate and reaches the plug 41 is formed.

Figure 2:
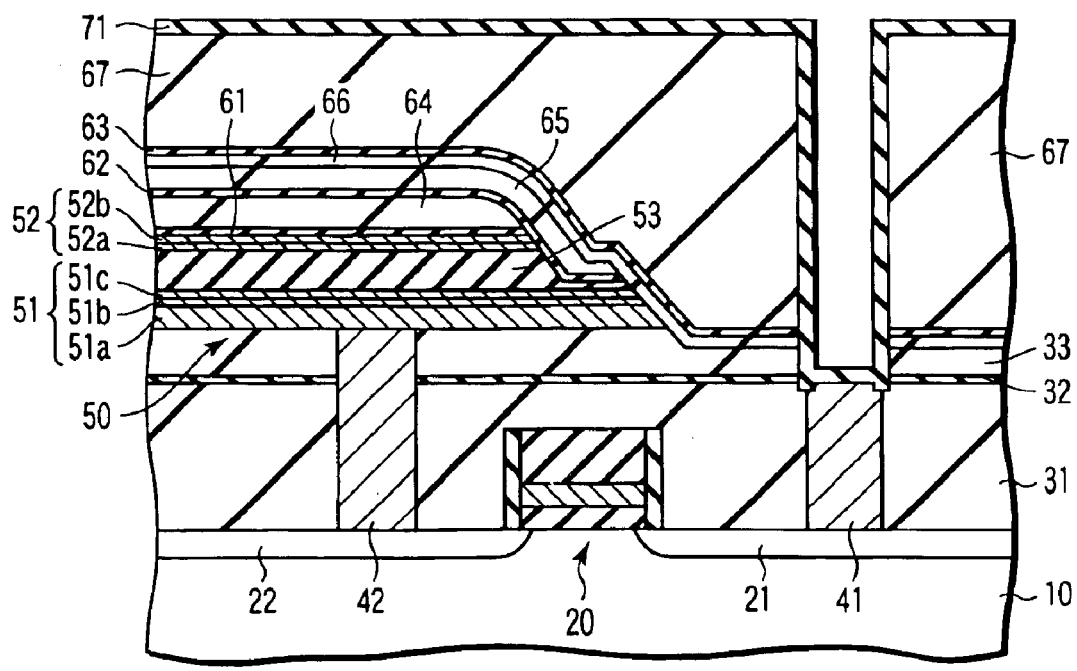

Next, as shown in FIG. 2, a silicon nitride film serving as an oxygen barrier film 71 is formed by chemical vapor deposition (CVD). The oxygen barrier film 71 is formed on an upper surface of the silicon oxide film 67 and on a side wall and a bottom of the contact hole 68. The oxygen barrier film 71 has barrier property against oxygen, and prevents oxidation of a plug formed in the contact hole 68 in the following step.

Figure 3:
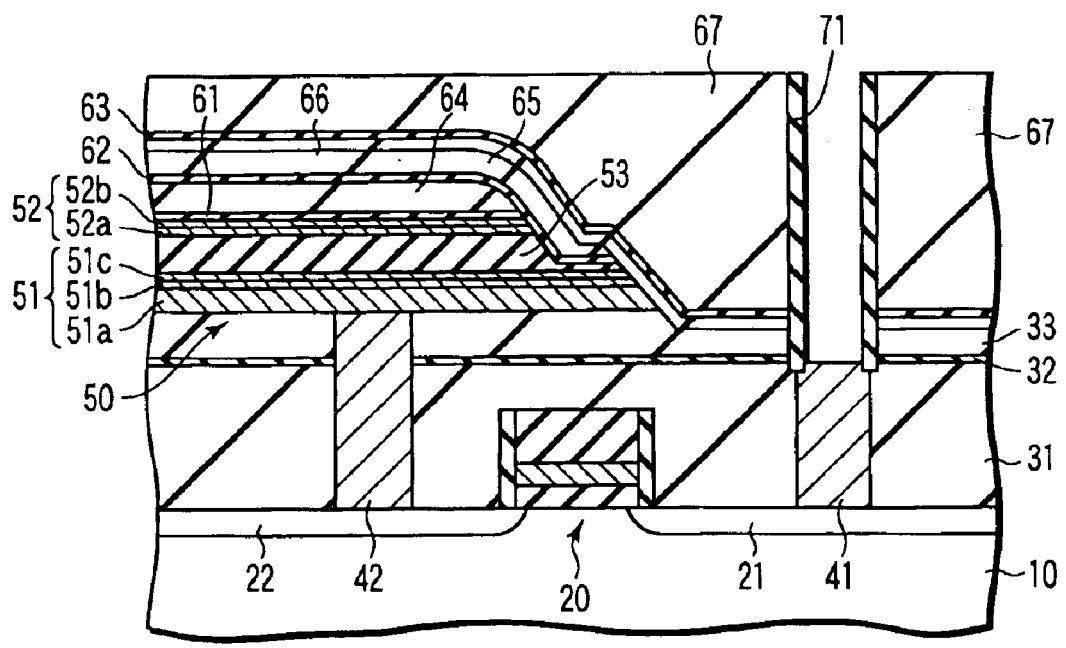

Next, as shown in FIG. 3, the oxygen barrier film 71 on the upper surface of the silicon oxide film 67 and the bottom of the contact hole 68 is removed by anisotropic etching such as RIE. As a result, the oxygen barrier film 71 remains only on the side wall of the contact hole 68.

Figure 4:
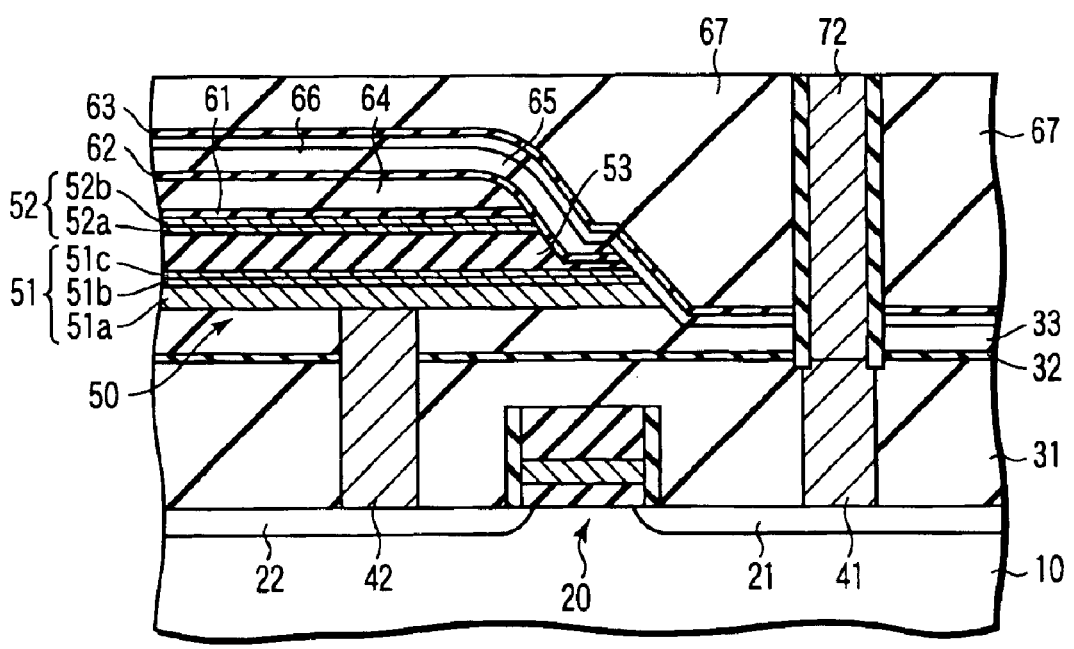

Next, as shown in FIG. 4, a tungsten (W) plug 72 is formed in the contact hole 68. Specifically, a tungsten film is formed on the whole surface by CVD. Thereafter, the tungsten film on the upper surface of the silicon oxide film 67 is removed by chemical mechanical polishing (CMP). Thereby, the contact hole 68 is filled with the tungsten plug (tungsten film) 72. Tungsten has an excellent filling property, and thus can fill the deep contact hole 68 with reliability.

Figure 5:
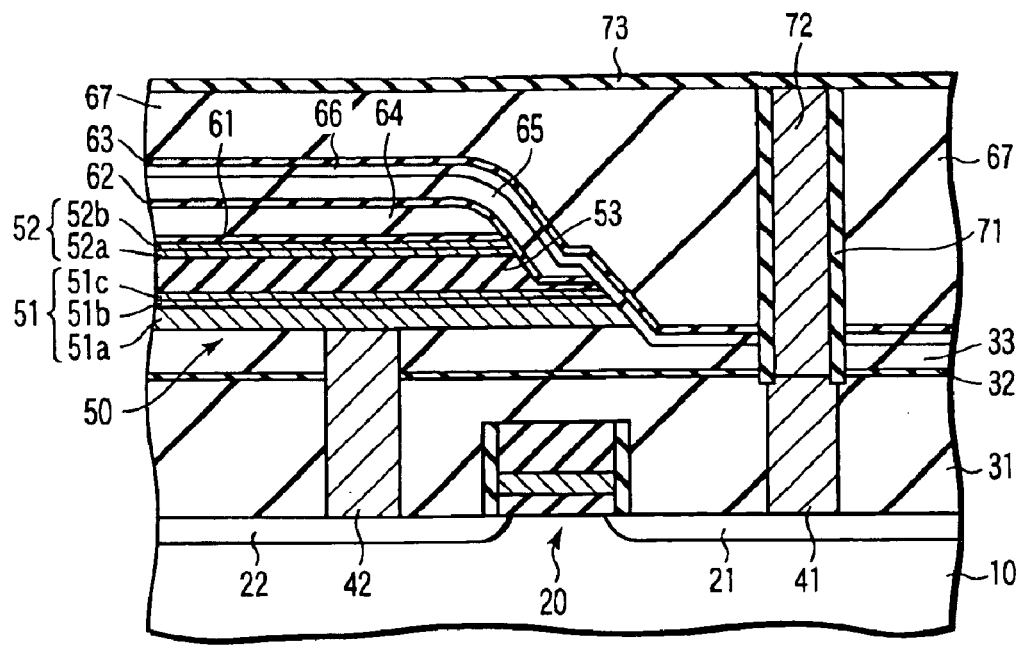

Next, as shown in FIG. 5, a silicon nitride film serving as an oxygen barrier film 73 is formed on the silicon oxide film 67 and the tungsten plug 72 using CVD. Like the oxygen barrier film 71, the oxygen barrier film 73 also prevents oxidation of the tungsten plug 72 formed in the contact hole 68.

Figure 6:
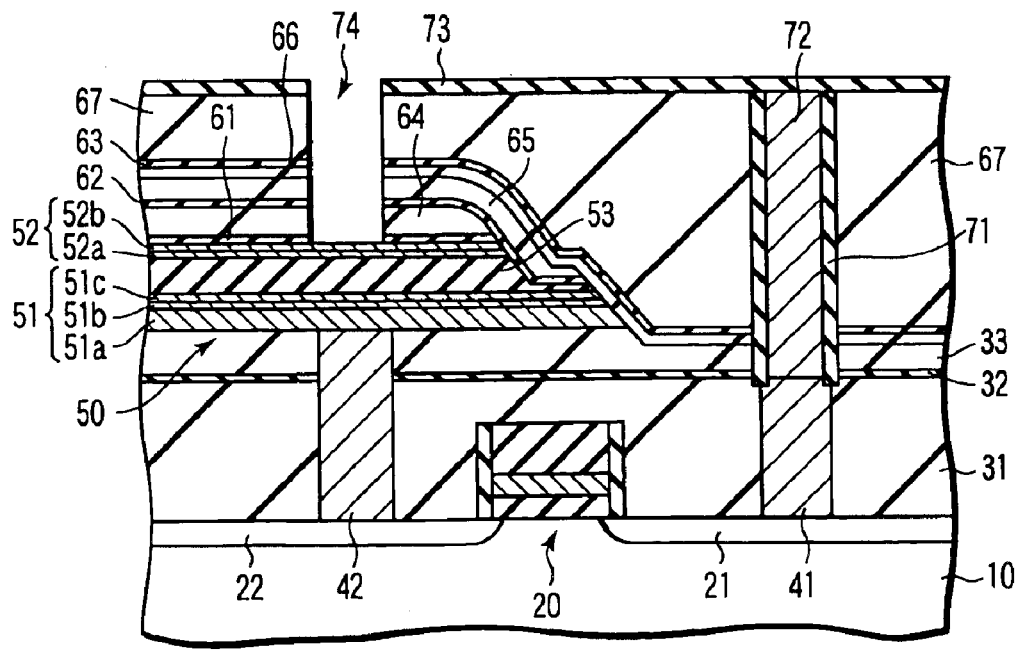

Next, as shown in FIG. 6, with a photoresist (not shown) used as mask, the alumina films 61, 62 and 63, the silicon oxide films 64, 65, 66 and 67 and the silicon nitride film 73 are etched. Anisotropic etching such as RIE is adopted as the etching. Thereby, a contact hole 74 which extends in a vertical direction with respect to the main surface of the semiconductor substrate and reaches the top electrode 52 is formed. The contact hole 74 is shallower than the contact hole 68.

Next, the structure of FIG. 6 is subjected to high-temperature annealing in oxygen atmosphere. The annealing is performed to recover the deterioration of the capacitor 50 which occurred in forming of the contact hole 74, processing of the capacitor 50 and deposition of the interlevel insulating films (silicon oxide film 67, etc.). In particular, in ferroelectric capacitors, this oxygen annealing is important to secure the property and reliability of the capacitor. In the oxygen annealing, oxygen included in the anneal atmosphere may be diffused into the silicon oxide film 67 and the like. In this embodiment, since the oxygen barrier film 71 is formed on the side wall of the tungsten plug 72, it is possible to prevent oxidation of the tungsten plug 72. Further, the oxygen barrier film 73 formed on the upper surface of the tungsten plug 72 can protect the tungsten plug 72 against the oxygen in the anneal atmosphere.

Figure 7:
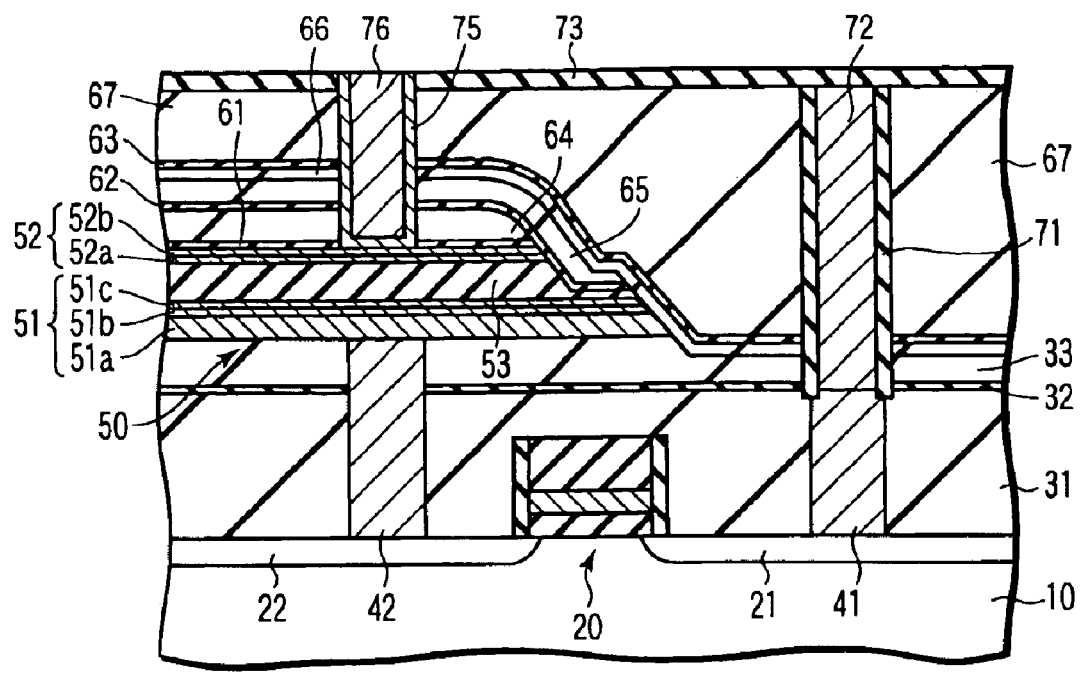

Next, as shown in FIG. 7, a barrier metal film 75 and an aluminum plug (conductive plug) 76 are formed in the contact hole 74. Specifically, first, a barrier metal film and an aluminum film are formed on the whole surface. Thereafter, the barrier metal film and the aluminum film on the oxygen barrier film 73 are removed by CMP. Thereby, the contact hole 74 is filled with the barrier metal film 75 and the aluminum plug (aluminum film) 76.

Figure 8:
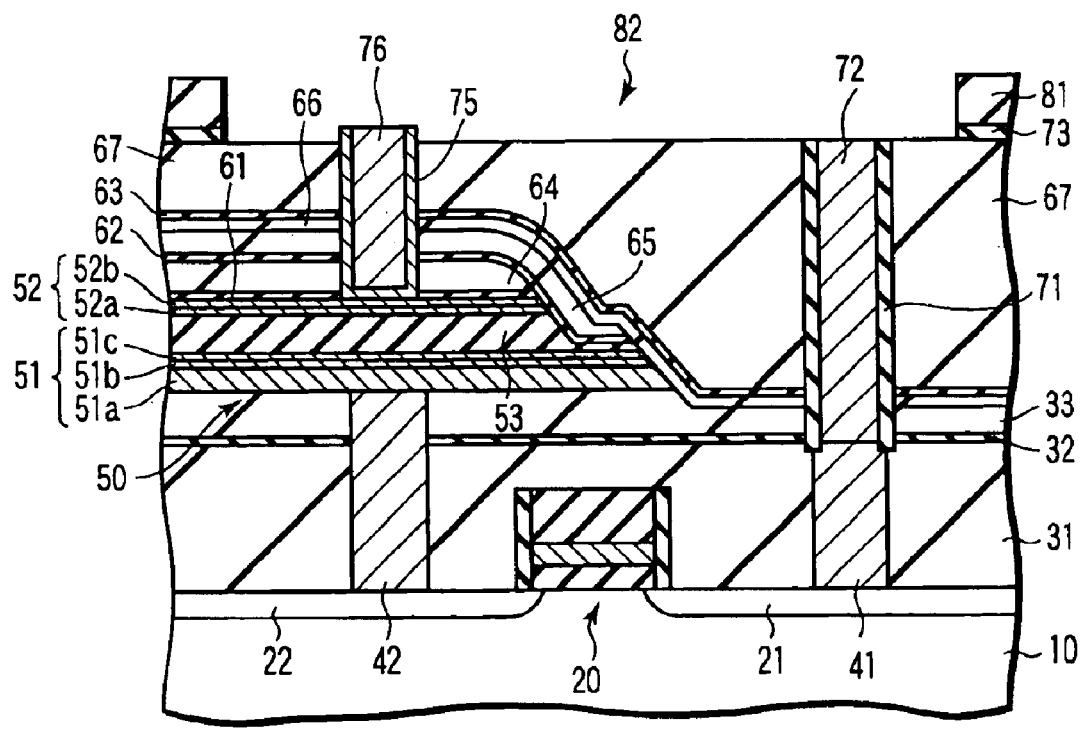

Next, as shown in FIG. 8, a silicon oxide film (interlevel insulating film) 81 is formed on the whole surface. Then, with a photoresist (not shown) used as mask, the oxygen barrier film 73 and the silicon oxide film 81 are removed by RIE or the like to expose the surfaces of the tungsten plug 72 and the aluminum plug 76. Thereby, a trench 82 is formed. Specifically, first, the silicon oxide film 81 is etched, with the oxygen barrier film (silicon nitride film) 73 used as etching stopper. Thereafter, the oxygen barrier film 73 is etched. The silicon oxygen film 81 is effectively etched, by using the oxygen barrier film 73 as etching stopper.

Figure 9:
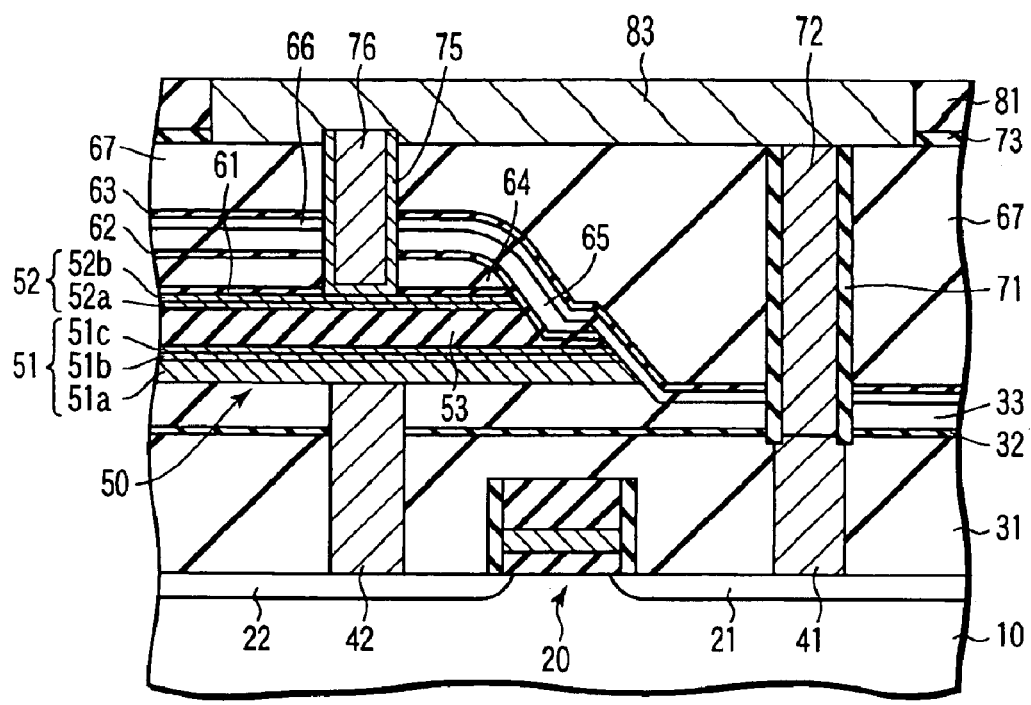

Next, as shown in FIG. 9, an aluminum film serving as wire 83 is formed in the trench 82. Specifically, first, the aluminum film is formed on the whole surface. Thereafter, the aluminum film on the upper surface of the silicon oxide film 81 is removed by CMP. Thereby, the wire 83 formed by filling the trench 82 with the aluminum film is obtained.

By the above method, a ferroelectric memory having the structure shown in FIG. 9 is formed.

As described above, in this embodiment, tungsten having an excellent filling property is used as the plug 72, and thus the deep contact hole 68 can be filled with reliability. Further, the oxygen barrier film 71 formed between the tungsten plug 72 and the side wall of the contact hole 68 can prevent oxidation of the tungsten plug 72. In particular, the oxygen barrier film 71 blocks the oxygen diffused through the interlevel insulating film, and thus it is possible to effectively prevent oxidation of the tungsten plug 72. Further, when oxygen annealing is performed to recover deterioration of the capacitor 50, the side wall of the tungsten plug 72 is covered with the oxygen barrier film 71 and the upper surface of the tungsten plug 72 is covered with the oxygen barrier film 73. Therefore, the tungsten plug 72 is securely prevented from being oxidized.

In the above embodiment, silicon nitride films are used as the oxygen barrier films 71 and 73. However, generally it is possible to use any insulating films having an oxygen permeability (permeability per unit thickness) lower than that of the silicon oxide films used as interlevel insulating films. Specifically, alumina films (aluminum oxide films) or titanium oxide films ($TiO_2$ films) may be used as the oxygen barrier films, as well as silicon nitride films. Further, a stacked film formed of at least two kinds of films selected from silicon nitride film, alumina film and titanium oxide film may be used as the oxygen barrier film.

Further, although a PZT film is used as the dielectric film 53 in the above embodiment, generally a ferroelectric film formed of metal oxide may be used. Specifically, as the dielectric film, an $SrBi_2Ta_2O_9$ film (SBT film) can be used as well as a PZT film.

Furthermore, in the above embodiment, a barrier metal film may be formed between the tungsten plug 72 and the oxygen barrier film 71. For example, a material such as TiN, NbN, Nb can be used as the barrier metal. Further, although the aluminum plug 76 is formed in the contact hole 74 in the above embodiment, a tungsten plug may be used instead of the aluminum plug.

Although the tungsten plug 72 is formed on the plug 41 in the above embodiment, the plug 41 is not necessarily provided. In the case of not providing the plug 41, when the contact hole 68 is formed, the silicon oxide film 31 is also etched to form a contact hole reaching the diffusion layer 41, and a tungsten plug is formed in the contact hole.

The above embodiment has a memory structure in which the top electrode 52 of the capacitor 50 is electrically connected to the source/drain diffusion layer 21 of the MIS transistor 20, and the bottom electrode 51 is electrically connected to the source/drain diffusion layer 22. The semiconductor device can adopt various memory structures as well as the above structure. For example, the device may have a structure of not connecting the tungsten plug 72 with the aluminum plug 76 by the wire 83. Further, the tungsten plug 72 may be electrically connected to the gate of the MIS transistor 20, instead of being electrically connected to the source/drain diffusion layer 21. The tungsten plug 72 may be electrically connected to a MIS transistor other than the MIS transistor 20. The tungsten plug 72 may be connected to wire provided in the insulation region. In short, any structure can be adopted, as long as the tungsten plug 72 is formed apart from the capacitor 50 and the depth of the contact hole 68 filled with the tungsten plug 72, is greater than the depth of the contact hole 74 filled with the aluminum plug 76. From a different point of view, any structure can be adopted as long as the height of the tungsten plug 72 (the distance between the upper surface and the lower surface of the tungsten plug 72) is greater than the height of the aluminum plug 76 (the distance between the upper surface and the lower surface of the aluminum plug 76).

Further, in the above embodiment, before the step of forming the contact hole 68 in FIG. 1, an additional oxygen barrier film may be formed on the silicon oxide film 67. In such a case, in the step shown in FIG. 2, a stacked film formed of the additional oxygen barrier film and the oxygen barrier film 71 is formed on the silicon oxide film 67. Therefore, in the etching step shown in FIG. 3, the oxygen barrier film remains on the upper surface of the silicon oxide film 67, and thereby it is possible to prevent oxygen from intruding into the silicon oxide film 67.

In the above embodiment, the wire 83 is formed by filling the trench 82 with an aluminum film. The wire 83 may be formed by patterning the aluminum film by RIE or the like.

In the above embodiment, a plug (plug 42) connected to the bottom electrode 51 is provided on a lower side of the bottom electrode 51. However, as shown in a modification of FIG. 10, a plug connected to the bottom electrode 51 may be formed on an upper side of the bottom electrode 51. A basic structure and a basic manufacturing method of a ferroelectric memory shown in FIG. 10 are the same as those of the ferroelectric memory described above, and a detailed explanation thereof is omitted.

Figure 10:
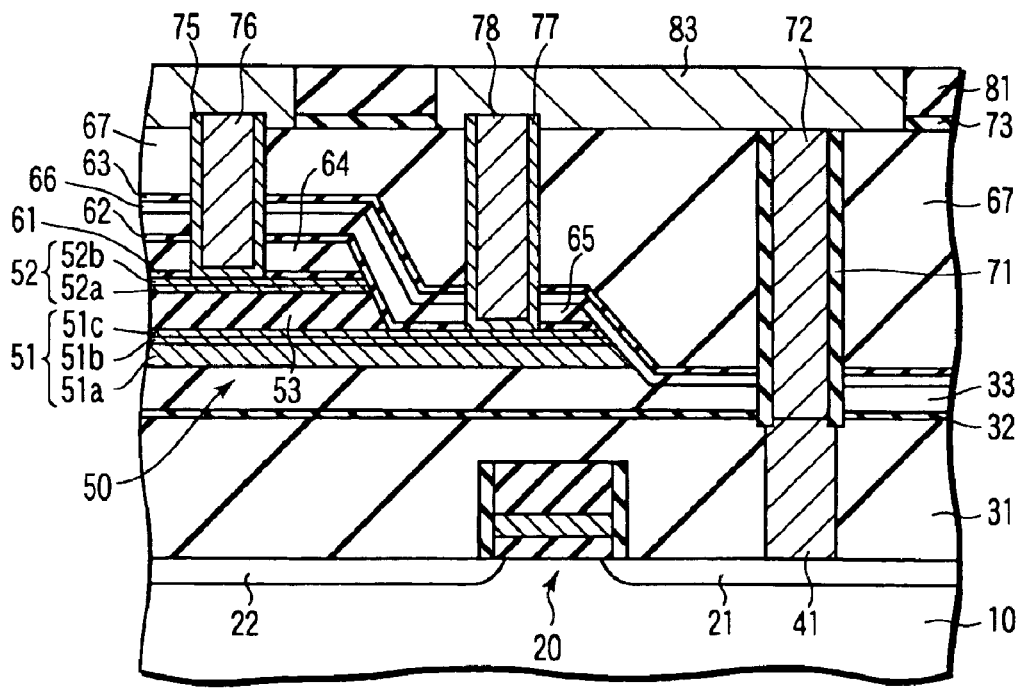
FIG. 10 is a cross-sectional view of a structure of a modification of the semiconductor device according to the embodiment of the present invention.

In the modification shown in FIG. 10, the contact hole filled with a barrier metal film 77 and an aluminum plug 78 is shallower than a contact hole filled with a tungsten plug 72. Specifically, the height of the tungsten plug 72 (the distance between the upper surface and the lower surface of the tungsten plug 72) is greater than the height of the aluminum plug 78 (the distance between the upper-surface and the lower surface of the aluminum plug 78).

It goes without saying that this modification can obtain the same advantageous effect as that obtained by the structure and the method shown in FIGS. 1–9.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a semiconductor substrate;
    a capacitor provided above the semiconductor substrate;
    an insulation region which covers the capacitor and has a first hole and a second hole, the first hole being provided apart from the capacitor and extending in a vertical direction with respect to a main surface of the semiconductor substrate, the second hole reaching an electrode of the capacitor, extending in the vertical direction with respect to the main surface of the semiconductor substrate and being shallower than the first hole;
    a tungsten plug provided in the first hole;
    a first oxygen barrier film provided between the tungsten plug and a side wall of the first hole; and
    a conductive plug provided in the second hole and connected to the electrode of the capacitor.

2. The semiconductor device according to claim 1, further comprising a second oxygen barrier film provided on the insulation region.

3. The semiconductor device according to claim 1, further comprising a transistor provided on the semiconductor substrate, wherein the tungsten plug is electrically connected to the transistor.

4. The semiconductor device according to claim 1, further comprising a wire provided on the insulation region and connected to the tungsten plug.

5. The semiconductor device according to claim 1, wherein the first oxygen barrier film includes at least one of a silicon nitride film, an alumina film and a titanium oxide film.

6. The semiconductor device according to claim 1, wherein a dielectric film of the capacitor includes a ferroelectric film.

7. The semiconductor device according to claim 6, wherein the ferroelectric film is formed of a metal oxide.

8. A method of manufacturing a semiconductor device, comprising:
    forming a capacitor above a semiconductor substrate, the capacitor being covered with an insulation region;
    forming a first hole in the insulation region, the first hole being provided apart from the capacitor and extending in a vertical direction with respect to a main surface of the semiconductor substrate;
    forming a first oxygen barrier film on a side wall of the first hole;
    forming a tungsten plug in the first hole being provided with the first oxygen barrier film;
    forming a second hole in the insulation region, the second hole reaching an electrode of the capacitor, extending in the vertical direction with respect to the main surface of the semiconductor substrate and being shallower than the first hole; and
    forming a conductive plug in the second hole.

9. The method according to claim 8, further comprising: forming a second oxygen barrier film on the insulation region and the tungsten plug, before forming the second hole.

10. The method according to claim 8, further comprising: annealing the capacitor in an atmosphere containing oxygen, after forming the second hole.

11. The method according to claim 8, further comprising: forming a transistor on the semiconductor substrate, before forming the capacitor, wherein the tungsten plug is electrically connected to the transistor.

12. The method according to claim 8, further comprising: forming a wire on the insulation region, the wire being connected to the tungsten plug.

13. The method according to claim 8, wherein the first oxygen barrier film includes at least one of a silicon nitride film, an alumina film and a titanium oxide film.

14. The method according to claim 8, wherein a dielectric film of the capacitor includes a ferroelectric film.

15. The method according to claim 8, wherein the ferroelectric film is formed of a metal oxide.

* * * * *